United States Patent
Blanken et al.

(10) Patent No.: US 6,433,634 B2
(45) Date of Patent: Aug. 13, 2002

(54) ELECTRONIC CIRCUIT FOR PROVIDING A DESIRED COMMON MODE VOLTAGE TO A DIFFERENTIAL OUTPUT OF AN AMPLIFIER STAGE

(75) Inventors: Pieter Gerrit Blanken; Stefan Eugene Josephus Menten, both of Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/822,474

(22) Filed: Mar. 30, 2001

(30) Foreign Application Priority Data

Mar. 31, 2000 (EP) .............................. 00201185

(51) Int. Cl.[7] .............................................. H03F 3/45
(52) U.S. Cl. ...................................... 330/253; 330/258
(58) Field of Search .............................. 330/253, 258, 330/259, 296

(56) References Cited

U.S. PATENT DOCUMENTS 6,285,259 B1 * 9/2001 Franck et al. ................ 330/253

FOREIGN PATENT DOCUMENTS

| EP | 0521215 A1 | 1/1993 |
| EP | 0618674 A2 | 10/1994 |
| WO | 9530271 A1 | 11/1995 |

* cited by examiner

Primary Examiner—Michael B Shingleton
(74) Attorney, Agent, or Firm—Aaron Waxler

(57) ABSTRACT

An electronic circuit for supplying a common mode voltage to a differential output of an amplifier stage (AMPSTG). The common mode voltage at the terminals (1) and (2) is approximately equal to the reference voltage ($V_{CM}$). Transistors ($T_1$–$T_4$) are biased in their linear region whereas transistors ($T_5$–$T_8$) are biased in their saturation region. In order to choose the lowest possible reference voltage ($V_{CM}$), the dimensioning of the transistors ($T_1$–$T_4$) is such that the currents through the transistors ($T_1$–$T_3$) have equal current densities, and the current through the transistor ($T_4$) has a current density which is a factor N smaller than the former current densities. The factor N is determined by the ratio of the nominal value of the current through the transistor ($T_1$) and the minimum value of the current through the transistor ($T_1$).

8 Claims, 2 Drawing Sheets

ELECTRONIC CIRCUIT FOR PROVIDING A DESIRED COMMON MODE VOLTAGE TO A DIFFERENTIAL OUTPUT OF AN AMPLIFIER STAGE

The invention relates to an electronic circuit for providing a desired common mode voltage to a differential output of an amplifier stage, which differential output comprises a first output terminal and a second output terminal, comprising a supply terminal; a first field effect transistor with a source coupled to the supply terminal; a second field effect transistor with a source coupled to the supply terminal; a third field effect transistor with a source coupled to the supply terminal and with a gate coupled so as to receive a reference voltage; a first cascode circuit with a first main current electrode coupled to a drain of the first field effect transistor, with a second main current electrode coupled to a gate of the first field effect transistor and to the first output terminal, and with a control electrode; a second cascode circuit with a first main current electrode coupled to a drain of the second field effect transistor and to the drain of the first field effect transistor, with a second main current electrode coupled to a gate of the second field effect transistor and to the second output terminal, and with a control electrode coupled to the control electrode of the first cascode circuit; a third cascode circuit with a first main current electrode coupled to a drain of the third field effect transistor, with a second main current electrode coupled to the control electrode of the first cascode circuit, and with a control electrode coupled to the control electrode of the first cascode circuit; and current means for providing a current through the third field effect transistor and the third cascode circuit.

Figure 1:
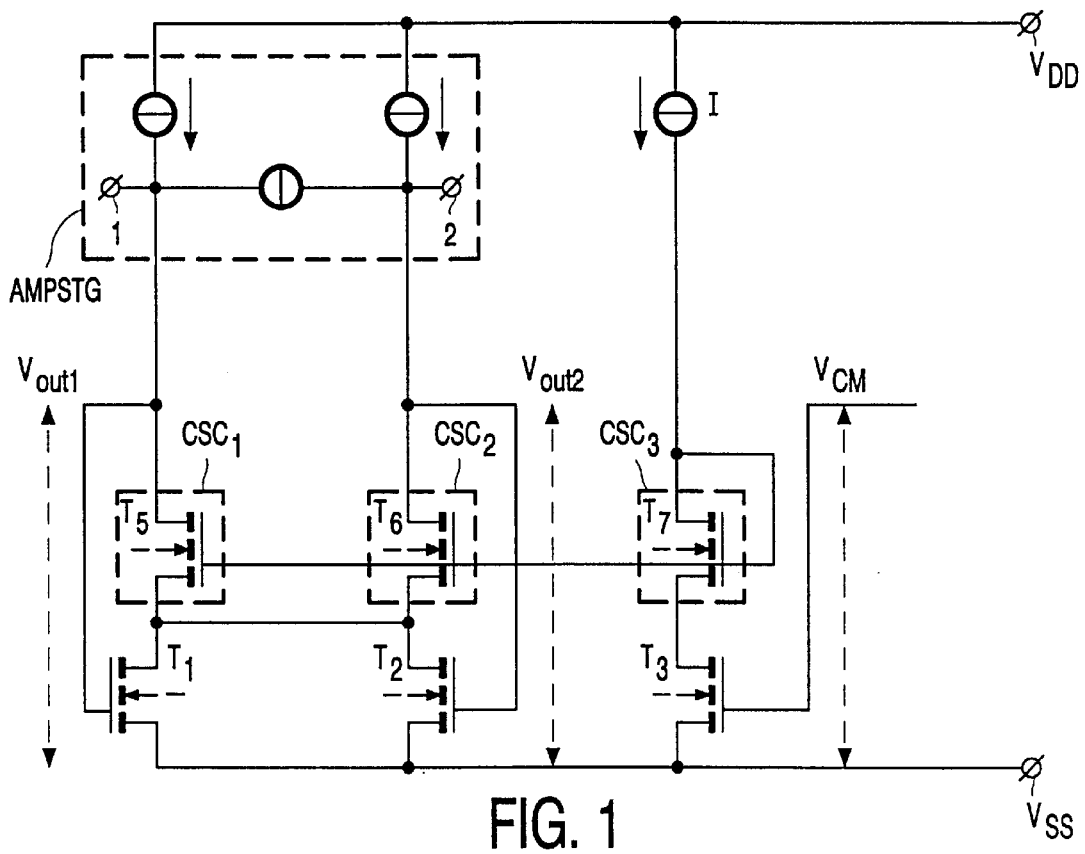

Such an electronic circuit is known from the prior art. The known electronic circuit is shown in FIG. 1 and comprises: first to third field effect transistors ($T_1$ to $T_3$), fifth to seventh cascode field effect transistors ($T_5$ to $T_7$), and a current source I for supplying a current through the third and the seventh field effect transistor $T_3$ and $T_7$. The electronic circuit receives a supply voltage between a first supply terminal $V_{SS}$ and a second supply terminal $V_{DD}$.

FIG. 1 also shows a model of a differential output of an amplifier stage AMPSTG, which differential output comprises a first output terminal 1 and a second output terminal 2. The sources of the first to third transistors $T_1$ to $T_3$ are connected to the first supply terminal $V_{SS}$. The drains of the first and second transistors $T_1$ and $T_2$ and the sources of the fifth and sixth transistors $T_5$ and $T_6$ are interconnected. The gate of the first transistor $T_1$ and the drain of the fifth transistor $T_5$ are connected to the first output terminal 1. The gate of the second transistor $T_2$ and the drain of the sixth transistor $T_6$ are connected to the second output terminal 2. The gates of the fifth, sixth, and seventh transistors $T_5$ to $T_7$ and the drain of the seventh transistor $T_7$ are interconnected. The drain of the third transistor $T_3$ is connected to the source of the seventh transistor $T_7$. The gate of the third transistor $T_3$ receives a reference voltage $V_{CM}$. The voltages at the output terminals 1 and 2 are referenced $V_{out1}$ and $V_{out2}$, respectively. The common mode voltage at the output terminals 1 and 2 per definition then is equal to the sum of $V_{out1}$ and $V_{out2}$ divided by 2. The electronic circuit is dimensioned such that the common mode voltage is equal to the reference voltage $V_{CM}$. This is represented in equation 1

$$\frac{V_{out1} + V_{out2}}{2} = V_{CM} \tag{1}$$

It should be noted that the first and the second transistor must always be set for their linear operation ranges if the electronic circuit is to operate correctly. In the known electronic circuit, the reference voltage $V_{CM}$, and accordingly also the common mode voltage at the first and the second output terminal 1 and 2, is usually chosen to be approximately equal to half the supply voltage. The reference voltage $V_{CM}$ is often greater than necessary then, but a sufficient margin is present for accommodating, for example, spreads in transistor parameters.

It is a disadvantage of the known electronic circuit, accordingly, that it is less suitable for applications in which an operation at a minimum supply voltage is desired.

It is an object of the invention to provide an electronic circuit capable of supplying a lowest possible common mode voltage to a differential output of an amplifier stage.

According to the invention, the electronic circuit mentioned in the opening paragraph is for this purpose characterized in that the electronic circuit further comprises: a fourth field effect transistor with a source coupled to the first supply terminal; a fourth cascode circuit with a first main current electrode coupled to a drain of the fourth field effect transistor, with a second main current electrode coupled to a gate of the fourth field effect transistor, and with a control electrode coupled to the control electrode of the first cascode circuit; further current means for supplying a current through the fourth field effect transistor and the fourth cascode circuit; and voltage-generating means coupled in series between the further current means and the second main current electrode of the fourth cascode circuit, and in that the gate of the third field effect transistor is coupled to the voltage-generating means for receiving the reference voltage, and in that the first, the second, and the third field effect transistor are dimensioned such that they have approximately the same current densities, and in that the fourth field effect transistor is dimensioned such that it has a current density which is a factor N smaller than said current densities, said factor N being approximately equal to the ratio of the nominal current to the minimum current through the first field effect transistor.

It is achieved thereby that the reference voltage to be defined is substantially independent of transistor parameters.

An embodiment of an electronic circuit according to the invention is characterized in that the first cascode circuit comprises a fifth transistor with a first and a second main current electrode which form the first and the second main current electrode, respectively, of the first cascode circuit, and with a control electrode which forms the control electrode of the first cascode circuit; and in that the second cascode circuit comprises a sixth transistor with a first and a second main current electrode which form the first and the second main current electrode, respectively, of the second cascode circuit, and with a control electrode which forms the control electrode of the second cascode circuit; and in that the third cascode circuit comprises a seventh transistor with a first and a second main current electrode which form the first and the second main current electrode, respectively, of the third cascode circuit, and with a control electrode which forms the control electrode of the third cascode circuit; and in that the fourth cascode circuit comprises an eighth transistor with a first and a second main electrode which form the first and the second main current electrode, respectively, of the fourth cascode circuit, and with a control electrode which forms the control electrode of the fourth cascode circuit.

A very simple embodiment for the cascode circuits is obtained thereby. The fifth to seventh transistors are either all implemented with bipolar transistors of the same conductivity type or all implemented with field effect transistors of the same conductivity type.

An embodiment of an electronic circuit according to the invention is furthermore characterized in that the fifth, the sixth, the seventh, and the eighth transistor are dimensioned such that they have approximately the same current densities.

As a result, the potentials at the drains of the first to fourth field effect transistors are approximately equal. This achieves a better accuracy for defining the common mode voltage at the first and the second output terminal 1 and 2.

Further advantageous embodiments of the electronic circuit according to the invention are defined in claims 4 to 8. It should be noted in this connection that the presence of the limiting means prevents the first or second field effect transistor from being fully switched off in the case of a too high differential output voltage at the differential output of the amplifier stage. A full switch-off of the first or second field effect transistor may lead to an unacceptably long recovery time in the known electronic circuit.

Figure 2:
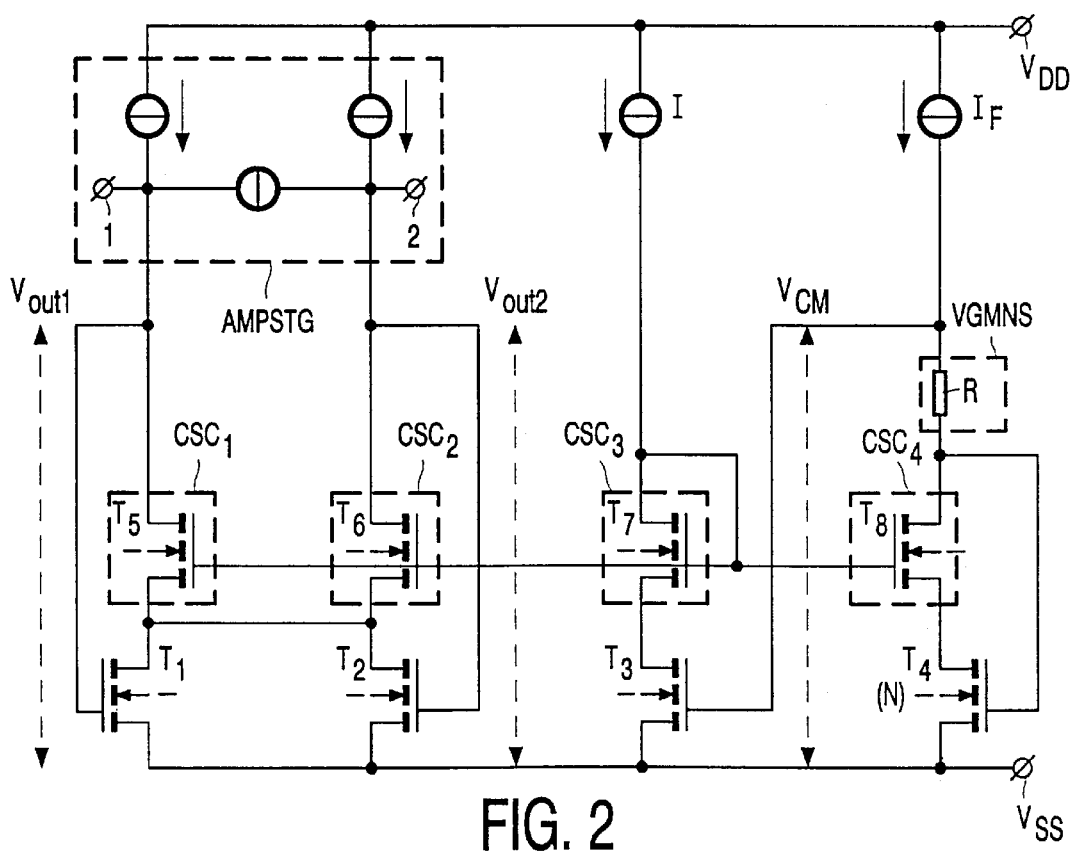
Figure 3:
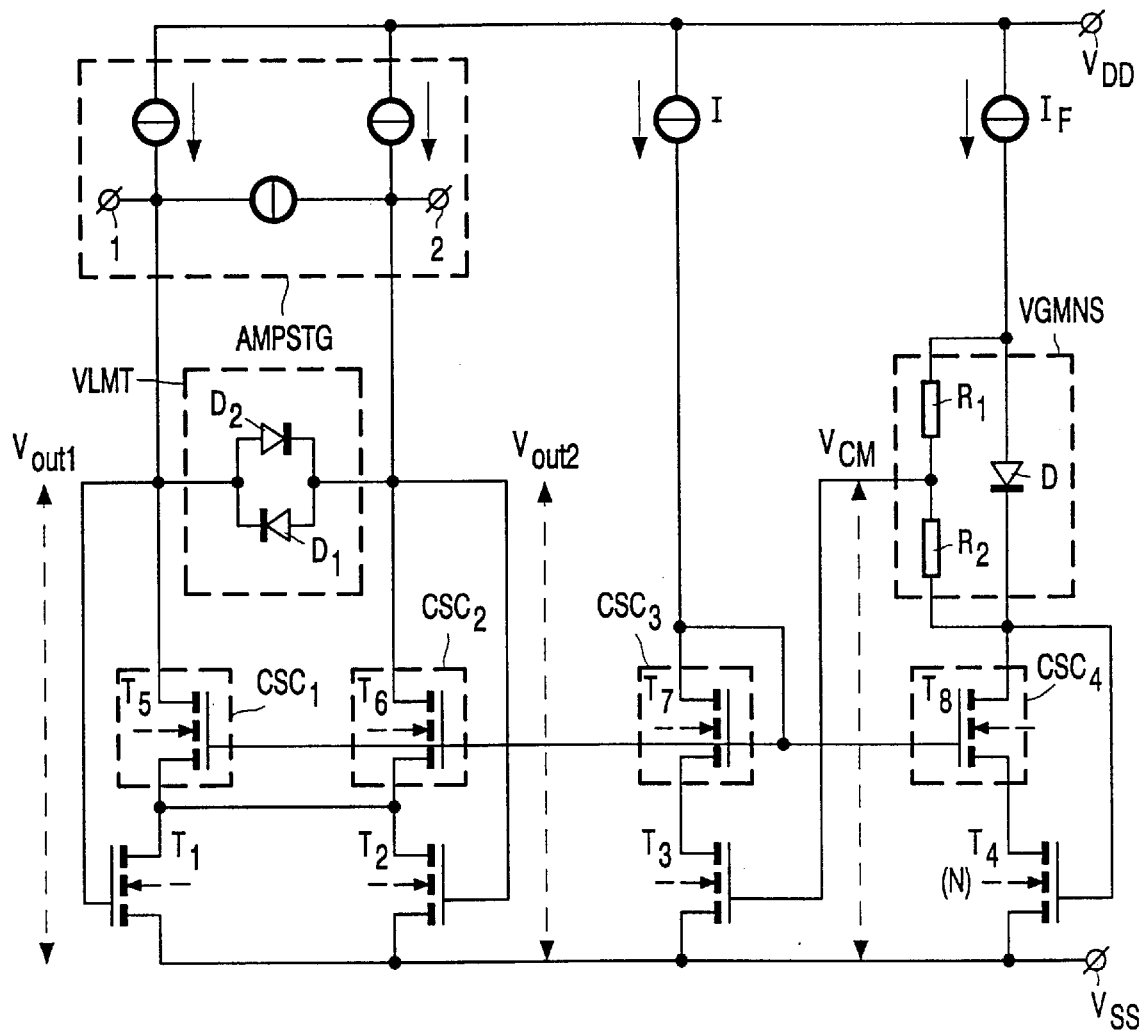

The invention will now be explained in more detail with reference to the accompanying drawing, in which:

FIG. 1 shows a known electronic circuit which supplies a common mode voltage to a differential output of an amplifier stage, FIG. 2 is a circuit diagram of a first embodiment of an electronic circuit according to the invention, and FIG. 3 is a circuit diagram of a second embodiment of an electronic circuit according to the invention.

The same components or elements have been given the same reference symbols in these Figures.

FIG. 2 is a circuit diagram of a first embodiment of an electronic circuit according to the invention. The circuit comprises the same elements as those shown in the circuit of FIG. 1, supplemented with the following elements:
- a fourth field effect transistor,
- an eighth cascode transistor,
- voltage-generating means VGMNS which in this case are constructed with a resistor R, and
- further current means $I_F$ for supplying a current through the fourth field effect transistor $T_4$ and the eighth cascode transistor $T_8$.

The further current source $I_F$ is coupled on the one hand to the second supply terminal $V_{DD}$ and on the other hand via the resistor R to the drain of the eighth cascode transistor $T_8$ and the gate of the fourth field effect transistor $T_4$. The gate of the third field effect transistor $T_3$ is coupled to the common junction point of the further current source $I_F$ and the resistor R. The source of the fourth field effect transistor $T_4$ is coupled to the first supply terminal $V_{SS}$. The drain of the fourth field effect transistor $T_4$ is coupled to the source of the eighth cascode transistor $T_8$. The gate of the eighth cascode transistor $T_8$ is coupled to the gate of the seventh cascode transistor $T_7$. Alternative electronic circuits could be used instead of the cascode transistors $T_5$ to $T_8$. This is diagrammatically indicated in FIG. 2 with the reference symbols $CSC_1$ to $CSC_4$. The currents through the transistors $T_1$, $T_2$, $T_5$, and $T_6$ are supplied from the output terminals 1 and 2 of the amplifier stage AMPSTG. The respective currents supplied by the current source I and the further current source $I_F$ may be chosen to be the same. This, however, is not necessary. What is the point in dimensioning of the circuit is that the current densities of the currents through the transistors $T_1$, $T_2$, and $T_3$ are approximately the same, and that the current density of the current through the fourth transistor $T_4$ is a factor N lower than the current densities mentioned above of the first to third transistors $T_1$ to $T_3$.

The current densities of the currents through the fifth to eighth transistors $T_5$ to $T_8$ are approximately equal. The dimensioning is such, furthermore, that the first and the second transistor $T_1$ and $T_2$ always operate in their linear regions.

The nominal current through the first transistor $T_1$ is the current which flows through the first transistor $T_1$ when the potentials $V_{out1}$ and $V_{out2}$ are equal to one another. This is the case when there is no signal at the differential output of the amplifier stage AMPSTG. If there is a signal at the differential output of the amplifier stage AMPSTG, the potentials $V_{out1}$ and $V_{out2}$ will be different. The current flowing through the first transistor $T_1$ will be a minimum when the potential $V_{out1}$ is a minimum, and accordingly the potential of $V_{out2}$ is a maximum. The electronic circuit is dimensioned such that the ratio of the nominal current to the minimum current through the first transistor $T_1$ is approximately equal to said factor N.

Apart from the equation 1 given above, the electronic circuit also complies with the mathematical relations as given by equations 2 to 6 below.

$$V_{out1} - V_{th} > V_{ds1,2} \tag{2}$$

$$V_{out2} - V_{th} > V_{ds1,2} \tag{3}$$

$$V_{out,min} = V_{th} + V_{ds1,2} \tag{4}$$

$$V_{out,max} = 2 \cdot V_{CM} - V_{out,min} = 2 \cdot V_{CM} - V_{th} - V_{ds1,2} \tag{5}$$

$$\beta_{1,2} > 2 \cdot \frac{(N-1)^2}{N} \cdot \frac{I}{(V_{out,max} - V_{out,min})^2} \tag{6}$$

$V_{th}$ is the threshold voltage of a field effect transistor. $V_{ds1,2}$ is the voltage between the drain and the source of the transistors $T_1$ and $T_2$. $V_{out,min}$ is the minimum voltage of $V_{out1}$ or $V_{out2}$. $V_{out,max}$ is the maximum voltage of $V_{out1}$ or $V_{out2}$. $\beta_{1,2}$ is the gain factor of the transistors $T_1$ and $T_2$. I is the nominal current through the first transistor $T_1$.

Since the voltage between the gate and the source of the first transistor $T_1$ is equal to $V_{out1}$, and the voltage between the gate and the source of the second transistor $T_2$ is equal to $V_{out2}$, it follows from equations 2 and 3 that the first and the second transistor $T_1$ and $T_2$ are always set for their linear operation regions. A suitable choice for the reference voltage $V_{CM}$ and a suitable choice of $V_{ds1,2}$ render it possible to calculate the values for $V_{out,min}$ and $V_{out,max}$ by means of the equations 4 and 5. Furthermore, the minimum gain factor $\beta_{1,2}$ can be calculated from equation 6. The factor N is chosen such that the ratio of the nominal current to the minimum current through the first transistor $T_1$ is equal to this factor N. To ensure that the first and the second transistor are always set for their linear operation regions, it is advisable to choose a value for the current gain $\beta_{1,2}$ which is slightly greater than the minimum value following from equation 6, for example greater by a factor 2.

FIG. 3 is a circuit diagram of a second embodiment of an electronic circuit according to the invention. A difference with the circuit diagram of FIG. 2 is that the voltage-generating means VGMNS are constructed in a different manner, i.e. by means of a diode D which is coupled in the forward direction between the further current source $I_F$ and the drain of the eighth transistor $T_8$. The diode D may be provided, for example, with a field effect transistor connected as a diode. A voltage divider is connected in parallel to the diode D, which divider comprises a series arrangement of a first resistor $R_1$ and a second resistor $R_2$. The central tap of this voltage divider is coupled to the gate of the third transistor $T_3$. Another difference is that the circuit diagram of FIG. 3 includes limiting means VLMT which are coupled between the first terminal 1 and the second terminal 2. The limiting means VLMT are constructed with a first limiting diode $D_1$ and a second limiting diode $D_2$ here, by way of example. The first limiting diode $D_1$ and the second limiting diode $D_2$ may each be fitted, for example, with a field effect transistor connected as a diode. The first limiting diode $D_1$ and the second limiting diode $D_2$ are connected in anti-parallel. The limiting means VLMT limit the maximum voltage difference between the first terminal 1 and the second terminal 2. It is ensured thereby that the first and the second transistor $T_1$ and $T_2$ can never be fully switched off, which would have the result that the electronic circuit would need a long recovery time. The diodes D, and $D_1$ and $D_2$ may possibly be mutually matched.

Although the electronic circuit may be used to advantage in an integrated circuit, it may alternatively be composed from discrete components. It is also possible to replace all p-conductivity type transistors with n-conductivity type transistors, provided all n-conductivity type transistors are replaced with p-conductivity type transistors at the same time.

What is claimed is:

1. An electronic circuit for providing a desired common mode voltage to a differential output of an amplifier stage (AMPSTG), which differential output comprises a first output terminal (1) and a second output terminal (2), comprising a supply terminal ($V_{SS}$); a first field effect transistor ($T_1$) with a source coupled to the supply terminal ($V_{SS}$); a second field effect transistor ($T_2$) with a source coupled to the supply terminal ($V_{SS}$); a third field effect transistor ($T_3$) with a source coupled to the supply terminal ($V_{SS}$) and with a gate coupled so as to receive a reference voltage ($V_{CM}$); a first cascode circuit ($CSC_1$) with a first main current electrode coupled to a drain of the first field effect transistor ($T_1$), with a second main current electrode coupled to a gate of the first field effect transistor ($T_1$) and to the first output terminal (1), and with a control electrode; a second cascode circuit ($CSC_2$) with a first main current electrode coupled to a drain of the second field effect transistor ($T_2$) and to the drain of the first field effect transistor ($T_1$), with a second main current electrode coupled to a gate of the second field effect transistor ($T_2$) and to the second output terminal (2), and with a control electrode coupled to the control electrode of the first cascode circuit ($CSC_1$); a third cascode circuit ($CSC_3$) with a first main current electrode coupled to a drain of the third field effect transistor ($T_3$), with a second main current electrode coupled to the control electrode of the first cascode circuit ($CSC_1$), and with a control electrode coupled to the control electrode of the first cascode circuit ($CSC_1$); and current means (I) for providing a current through the third field effect transistor ($T_3$) and the third cascode circuit ($CSC_3$), characterized in that the electronic circuit further comprises: a fourth field effect transistor ($T_4$) with a source coupled to the first supply terminal ($V_{SS}$); a fourth cascode circuit ($CSC_4$) with a first main current electrode coupled to a drain of the fourth field effect transistor ($T_4$), with a second main current electrode coupled to a gate of the fourth field effect transistor ($T_4$), and with a control electrode coupled to the control electrode of the first cascode circuit ($CSC_1$); further current means ($I_F$) for supplying a current through the fourth field effect transistor ($T_4$) and the fourth cascode circuit ($CSC_4$); and voltage-generating means (VGMNS) coupled in series between the further current means ($I_F$) and the second main current electrode of the fourth cascode circuit ($CSC_4$), and in that the gate of the third field effect transistor ($T_3$) is coupled to the voltage-generating means (VGMNS) for receiving the reference voltage ($V_{CM}$), and in that the first ($T_1$), the second ($T_2$), and the third ($T_3$) field effect transistor are dimensioned such that they have approximately the same current densities, and in that the fourth field effect transistor ($T_4$) is dimensioned such that it has a current density which is a factor N smaller than said current densities, said factor N being approximately equal to the ratio of the nominal current to the minimum current through the first field effect transistor ($T_1$).

2. An electronic circuit as claimed in claim 1, characterized in that the first cascode circuit ($CSC_1$) comprises a fifth transistor ($T_5$) with a first and a second main current electrode which form the first and the second main current electrode, respectively, of the first cascode circuit ($CSC_1$), and with a control electrode which forms the control electrode of the first cascode circuit ($CSC_1$); and in that the second cascode circuit ($CSC_2$) comprises a sixth transistor ($T_6$) with a first and a second main current electrode which form the first and the second main current electrode, respectively, of the second cascode circuit ($CSC_2$), and with a control electrode which forms the control electrode of the second cascode circuit ($CSC_2$); and in that the third cascode circuit ($CSC_3$) comprises a seventh transistor ($T_7$) with a first and a second main current electrode which form the first and the second main current electrode, respectively, of the third cascode circuit ($CSC_3$), and with a control electrode which forms the control electrode of the third cascode circuit ($CSC_3$); and in that the fourth cascode circuit ($CSC_4$) comprises an eighth transistor ($T_8$) with a first and a second main electrode which form the first and the second main current electrode, respectively, of the fourth cascode circuit ($CSC_4$), and with a control electrode which forms the control electrode of the fourth cascode circuit ($CSC_4$).

3. An electronic circuit as claimed in claim 2, characterized in that the fifth ($T_5$), the sixth ($T_6$), the seventh ($T_7$), and the eighth ($T_8$) transistor are dimensioned such that they have approximately the same current densities.

4. An electronic circuit as claimed in claim 1, characterized in that the voltage-generating means (VGMNS) comprise a resistive element (R) which is connected in series between the further current means ($I_F$) and the second main current electrode of the fourth cascode circuit ($CSC_4$).

5. An electronic circuit as claimed in claim 1, characterized in that the voltage-generating means (VGMNS) comprise: a diode (D) which is coupled in forward direction between the further current means ($I_F$) and the second main current electrode of the fourth cascode circuit ($CSC_4$); and a voltage divider ($R_1$, $R_2$) which is coupled by a first end to the further current means ($I_F$), which is coupled by a second end to the second main current electrode of the fourth cascode circuit ($CSC_4$), and which is coupled by an intermediate tap to the gate of the third field effect transistor ($T_3$) for the purpose of supplying the reference voltage ($V_{CM}$).

6. An electronic circuit as claimed in claim 1, characterized in that the electronic circuit further comprises limiting means (VLMT) for limiting the maximum voltage difference between the first terminal (1) and the second terminal (2).

7. An electronic circuit as claimed in claim 6, characterized in that the limiting means (VLMT) comprise: a first limiting diode ($D_1$); and a second limiting diode ($D_2$), and in that the first limiting diode ($D_1$) and the second limiting diode ($D_2$) are connected in anti-parallel.

8. An electronic circuit as claimed in claim 7, characterized in that the absolute value of the maximum voltage difference between the first terminal (1) and the second terminal (2) is approximately equal to the absolute value of the voltage across the diode (D).

* * * * *